United States Patent [19]
Hirata

[11] Patent Number: 5,905,287
[45] Date of Patent: May 18, 1999

[54] SEMICONDUCTOR DEVICE WITH HIGH VOLTAGE PROTECTION

[75] Inventor: Morihisa Hirata, Tokyo, Japan

[73] Assignee: NEC Corporation, Tokyo, Japan

[21] Appl. No.: 08/837,344

[22] Filed: Apr. 17, 1997

[30] Foreign Application Priority Data

Apr. 25, 1996 [JP] Japan ................................ 8-103037

[51] Int. Cl.⁶ ............................................. H01L 23/62
[52] U.S. Cl. ........................................ 257/355; 257/357
[58] Field of Search .................................. 257/355–363

[56] References Cited

U.S. PATENT DOCUMENTS

| | | | |
|---|---|---|---|
| 4,609,931 | 9/1986 | Koike | 257/357 |
| 5,160,990 | 11/1992 | Osawa | 257/355 |
| 5,235,201 | 8/1993 | Honna | 257/355 |
| 5,654,571 | 8/1997 | Tsuji | 257/357 |
| 5,679,971 | 10/1997 | Tamba et al. | 257/357 |
| 5,714,784 | 2/1998 | Ker et al. | 257/360 |

*Primary Examiner*—David B. Hardy
*Attorney, Agent, or Firm*—Young & Thompson

[57] ABSTRACT

The object of the present invention is to provide a semiconductor device, which has a high protective capability against an excessive voltage applied from the outside. The device is provided, in its analog switch 30, with a P type dummy transistor 11 whose drain terminal is connected to a P type diffusion layer in the outside of a P type transfer gate 4 and whose gate and source terminals are connected to a power supply potential, and an N type dummy transistor 12 whose drain terminal is connected to an N type diffusion layer in the outside of an N type transfer gate 5 and whose gate and source terminals are connected to a ground potential, and when an excessive voltage is applied from the outside, an excessive current is made to flow through the P type and N type dummy transistors 11 and 12 to the power supply potential or the ground potential.

11 Claims, 9 Drawing Sheets

SEMICONDUCTOR DEVICE WITH HIGH VOLTAGE PROTECTION

BACKGROUND OF THE INVENTION

1. Field of the Invention

The present invention relates to a semiconductor integrated circuit, and more particularly to a transfer gate which uses an insulated gate electric field effect transistor (referred to as a MOS transistor, hereinafter).

2. Description of the Related Art

FIG. 1 is a circuit diagram showing one constitutional example of a conventional semiconductor device.

Referring to FIG. 1, this conventional semiconductor device is composed of an analog switch 130, which is for transmitting an analog signal from an input pad to an output pad, and a protective circuit 20, which is for protecting the analog switch 130. A signal input from an analog signal 9 is transmitted through the analog switch 130 and the protective circuit 20 to a bonding pad 1, a signal input from the bonding pad 1 is transmitted through the protective circuit 20 and the analog switch 130 to the analog signal 9, and so on. In the analog switch 130, there are provided side by side a P type transfer gate 4 and an N type transfer gate 5, to whose gate terminals reverse phase control signals 10 are input by inverters 6a and 6b respectively. In the protective circuit 20, there are provided a P type protective transistor 2, with its source and gate terminals connected to a power supply potential 7 and its drain terminal connected to the bonding pad 1, and an N type protective transistor 3, with its source and gate terminals connected to a ground potential and its drain terminal connected to the bonding pad 1.

FIG. 2 is a view showing a layout example of the analog switch 130 shown in FIG. 1.

FIG. 3(a) is a section view taken along the line C–C' of the analog switch 130 shown in FIG. 2, and FIG. 3(b) is a section view taken along the line D–D' of the analog switch 130 shown in FIG. 2.

Referring to FIG. 2, the bonding pad 1 is connected through a second layer metallic wiring 101-1 and first layer metallic wirings 102-1 and 102-4 to the N type diffusion layers 104-1 and 104-3 of the N type transfer gate 5 and to the P type diffusion layers 103-2 and 103-4 of the P type transfer gate 4. Thereby, the bonding pad 1 and the analog switch 130 are interconnected.

Herein, an N type diffusion layer 104-2 in the internal side of the N type transfer gate 5 and a P type diffusion layer 103-3 in the internal side of the P type transfer gate 4 are connected through a first layer metallic wiring 102-7 to an internal circuit.

Furthermore, in order to prevent latching up, the N type transfer gate 5 is surrounded by a P type diffusion layer 103-1, which is connected to a ground potential (Vss) 8. Also, the P type transfer gate 4 is surrounded by an N type diffusion layer 104-4, which is connected to the power supply potential (Vdd) 7.

The operation of the analog switch thus constructed will be described below.

When a control signal 10 is at a low level, the P type transfer gate 4 and the N type transfer gate 5 are both made to be non-conductive, and thus the outside and the inside of the chip are electrically shielded from each other.

When a control signal 10 is at a high level, the P type transfer gate 4 and the N type transfer gate 5 are both made to be conductive, and thus a signal having an optional potential between the ground potential 8 and the power supply potential 7 is transmitted from the external bonding pad 1 to the internal analog signal 9, or from the internal analog signal 9 to the external bonding pad 1.

Next, the operation of the protective circuit 20 for preventing the breakdown of the transistor, which constitutes the analog switch 130, will be described. This breakdown occurs when an excessive voltage of static electricity and so on is applied from the outside.

When a positive excessive voltage is applied to the ground from the outside, first a breakdown occurs in the N type diffusion layer in the gate terminal side of the drain terminal of the N type protective transistor 3 and thus a current is made to flow to a P type well. A breakdown voltage in this case will be referred to as BVDS.

Then, by lowering of the voltage caused by the current which has flown into the P type well, the N type diffusion layer of the source terminal and a diode is formed by the P type well are forward biased, a parasitic NPN type bipolar transistor is formed by the drain terminal, the P type well and the source terminal is made to be in an operation state (referred to as a snapback operation state, hereinafter), and an excessive current coming from the outside is made to flow to the ground.

After the snapback operation state has been realized, a potential for the drain terminal of the N type protective transistor 3 is fixed at a value lower than that of the breakdown voltage of the N type diffusion layer, which has been connected to the bonding pad 1 of the N type transfer gate 5, and thereby the analog switch 130 is prevented from being broken down.

When a negative excessive voltage is applied to the ground from the outside, the drain diffusion layers of the N type protective transistor 3 are forward biased, a current is made to flow to the ground through the P type well, and thereby the analog switch 130 is prevented from being broken down.

When a positive excessive voltage is applied to the power source from the outside, the drain diffusion layers of the P type protective transistor 2 are forward biased, a current is made to flow to the power source through an N type well, and thereby the analog switch 130 is prevented from being broken down.

Also, when a negative excessive voltage is applied to the power source from the outside, first a breakdown occurs in the P type diffusion layer in the gate terminal side of the drain terminal of the P type protective transistor 2, and thus a current is made to flow to the N type well.

Then, by lowering of the voltage caused by the current which has flown into the N type well, the P type diffusion layer of the source terminal and a diode is formed by the N type well are forward biased, a parasitic PNP type bipolar transistor is formed by the drain terminal, the N type well and the source terminal are made to be in a snapback operatation state and thus an excessive current coming from the outside is made to flow to the power source.

After the snapback operation state has been realized, a potential for the drain terminal of the P type protective transistor is fixed at a value lower than that of the breakdown voltage of the P type diffusion layer, which has been connected to the bonding pad 1 of the P type transfer gate 4, and thereby the analog switch is prevented from being broken down.

FIG. 4 is a circuit diagram showing another constitutional example of a conventional semiconductor device.

Referring to FIG. 4, the conventional semiconductor device of this example is composed of a NOR type output circuit 140, and a protective circuit 20, which is for protecting the NOR type output circuit 140. A signal input from a data signal 18 is transmitted through the NOR type output circuit 140 and the protective circuit 20 to a bonding pad 1, a signal input from the bonding pad 1 is transmitted through the protective circuit 20 and the NOR type output circuit 140 to the data signal 18, and so on. In the NOR type output circuit 140, there are provided a P type transistor 13 and an N type transistor 16, which are connected to a control signal 17, and P type transistor 14 and an N type transistor 15, which are connected to the data signal 18. In the protective circuit 20, there are provided a P type protective transistor 2 with its source and gate terminals connected to a power supply potential 7 and its drain terminal connected to the bonding pad 1, and an N type protective transistor 3 with its source and gate terminals connected to a ground potential and its drain terminal connected to the bonding pad 1.

FIG. 5 is a view showing the layout example of a NOR type outout circuit shown in FIG. 4.

Referring to FIG. 5, a P type diffusion layer 103-4 in the drain part of a vertically placed P type transistor is connected to the pad through a first layer metallic wiring 102-1, a contact C2 between first and second layer metallic wirings and a second layer metallic wiring 101-1.

As in the case of the semiconductor device shown in FIG. 2, because of corner parts formed in the diffusion layers, an excessive current flows to the corner parts in a concentrated manner when an excessive voltage is applied from the outside, and consequently the diffusion layers are destroyed.

The application of a positive excessive voltage to the ground, including the N type transfer gate 5, will be described in detail below.

The drain terminal of the N type protective transistor 3 and the N type diffusion layer of the N type transfer gate 5 are almost at the same potential, because these are interconnected by a low resistant metallic wiring.

For the N type diffusion layer of the N type transfer gate 5, a breakdown occurs in its field oxidized film end. A breakdown voltage in this case will be referred to as BVJ.

Herein, BVJ depends on the layout of the analog switch.

FIG. 6 is a view showing a breakdown voltage for the semiconductor device shown in FIG. 2.

Referring to FIG. 6, a BVJ 1 is a breakdown voltage when the diffusion layer end of a certain side does not intersect that of another side as in the case of the N type diffusion layer 104-2 shown in FIG. 2. A BVJ 2 is a breakdown voltage when the diffusion layer end of a certain side intersects that of another diffusion layer as in the case of the N type diffusion layers 104-1 and 104-3. A BVDS is a breakdown voltage for the N type protective transistor 3.

In the N type diffusion layers 104-1 and 104-3, a breakdown occurs in the corner parts of the diffusion layers before the diffusion layer edges, because electric fields concentrate therein. Consequently, the BVJ 2 is lower than the BVJ 1, which is a breakdown voltage when there are no corner parts in the diffusion layers.

As shown in FIG. 6, when the BVJ 2 for the N type diffusion layer of the N type transfer gate is lower than the BVDS for the N type protective transistor, if an excessive voltage is applied from the outside, a breakdown occurs in the corner part of the N type diffusion layer of the N type transfer gate before the N type protective transistor functions as a protective transistor, and since currents concentrate in the narrow corner part of the diffusion layer, the diffusion layer is destroyed.

The foregoing description was for the case when a positive excessive voltage was applied to the ground. It should be understood, however, that when a negative excessive voltage is applied to the power source, by replacing the N type diffusion layer of the N type transfer gate 5 and the N type protective transistor 3, described above, respectively with the P type diffusion layer of the P type transfer gate 4 and the P type protective transistor 2, the P type diffusion layer of the P type is destroyed by the excessive voltage.

As apparent from the foregoing, there was a problem inherent in the conventional semiconductor device. Specifically, when an excessive voltage was applied from the outside, there was a possibility of a breakdown in the device, caused by a voltage lower than a breakdown voltage in the protective transistor.

SUMMARY OF THE INVENTION

The present invention was made in light of the foregoing problem inherent in the prior art, and it is an object of the invention to provide a semiconductor device, which has a high protective capability against an excessive voltage applied from the outside.

The object of the present invention is achieved by a semiconductor device, which comprises a plurality of pads for performing signal inputting and outputting, an analog switch having P type and N type MOS transistors for transmitting signals among the pads or between the pads and an internal analog circuit and a protective circuit having P type and N type protective MOS transistors for protecting the analog switch, the analog switch being provided in a spot, in which diffusion layer ends divided by the gate of the N type MOS transistor are connected to the pads, an N type dummy transistor formed by using the diffusion layers as drains and connecting a gate and a source to a ground potential.

The object of the present invention is also achieved by a semiconductor device, which comprises a plurality of pads for performing signal inputting and outputting, an analog switch having P type and N type MOS transistors for transmitting signals among the pads or between the pads and-an internal analog circuit and a protective circuit having P type and N type protective MOS transistors for protecting the analog switch, the analog switch being provided in a spot, in which diffusion layer ends divided by the gate of the P type MOS transistor are connected to the pads, a P type dummy transistor is formed by using the diffusion layers as drains and connecting a gate and a source to a power supply potential and the dummy transistor having the same structure as that of the protective MOS transistor.

The object of the present invention is further achieved by a semiconductor device, which comprises a plurality of pads for performing signal inputting and outputting, an output circuit having two or more P type MOS transistors connected in series between a power supply potential and the pads and a protective circuit having P type and N type protective MOS transistors for protecting the output circuit, the output circuit being provided in a spot, in which diffusion layer ends divided by the gates of the P type MOS transistors are connected to the pads, a P type dummy transistor is formed by using the diffusion layers as drains and connecting a gate and a source to the power supply potential and the output circuit being a NOR type output circuit.

The object of the present invention is yet further achieved by a semiconductor device, which comprises a plurality of pads for performing signal inputting and outputting, an output circuit having two or more N type MOS transistors connected in series between a ground potential and the pads and a protective circuit having P type and N type protective MOS transistors for protecting the output circuit, the output circuit being provided with in a spot, in which diffusion layer ends divided by the gates of the N type MOS transistors are connected to the pads, an N type dummy transistor is formed by using the diffusion layers as drains and connecting a gate and a source to the ground potential, the output circuit being a NAND type output circuit and the dummy transistor having the same structure as that of the protective MOS transistor.

According to the present invention which provides a semiconductor device thus constructed, when an excessive voltage of static electricity or the like, is applied through the pads to the semiconductor device, an excessive current is made to flow to the ground by the dummy transistor, and thereby the occurrence of a breakdown at a voltage lower than the breakdown voltage of the protective transistor can be prevented and the breakdown of the MOS transistor can be prevented.

BRIEF DESCRIPTION OF THE DRAWINGS

For a more complete understanding of the present invention and the advantages thereof, reference is now made to the following description taken in conjunction with the accompanying drawings.

DETAILED DESCRIPTION OF THE PREFERRED EMBODIMENTS

The preferred embodiments of the semiconductor device of the present invention will be described below with reference to the accompanying drawings.

(First Embodiment)

Figure 1:
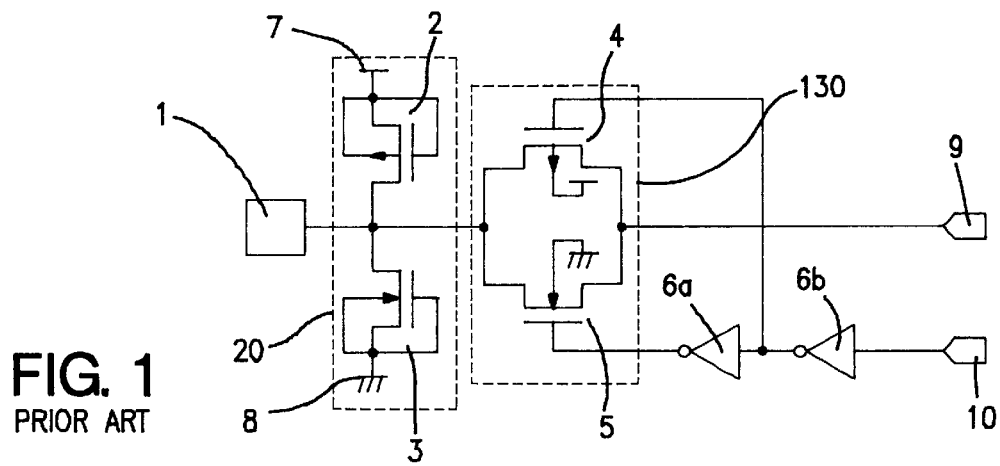
FIG. 1 is a circuit diagram showing one constitutional example of a conventional semiconductor device.
Figure 3A:
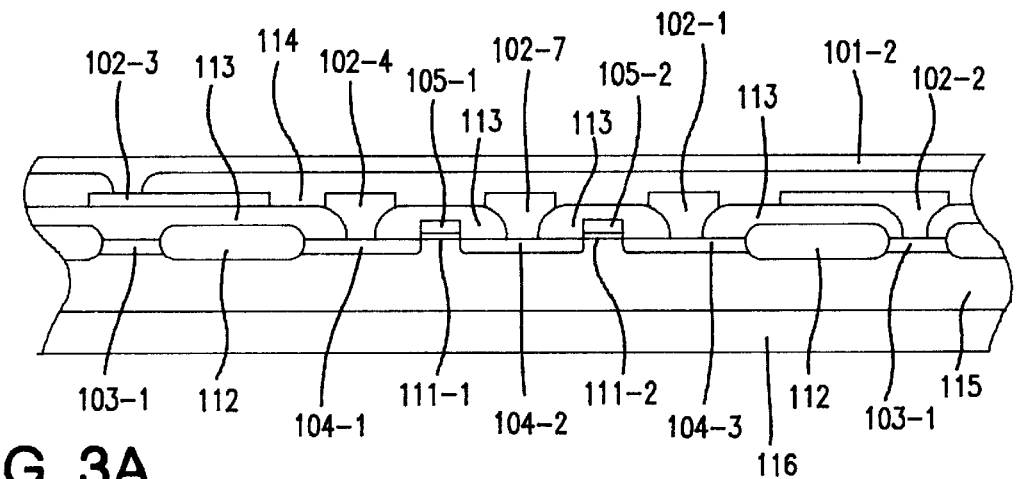
FIG. 3(a) is a section view taken along a line C–C' of the analog switch shown in FIG. 2.
Figure 3B:
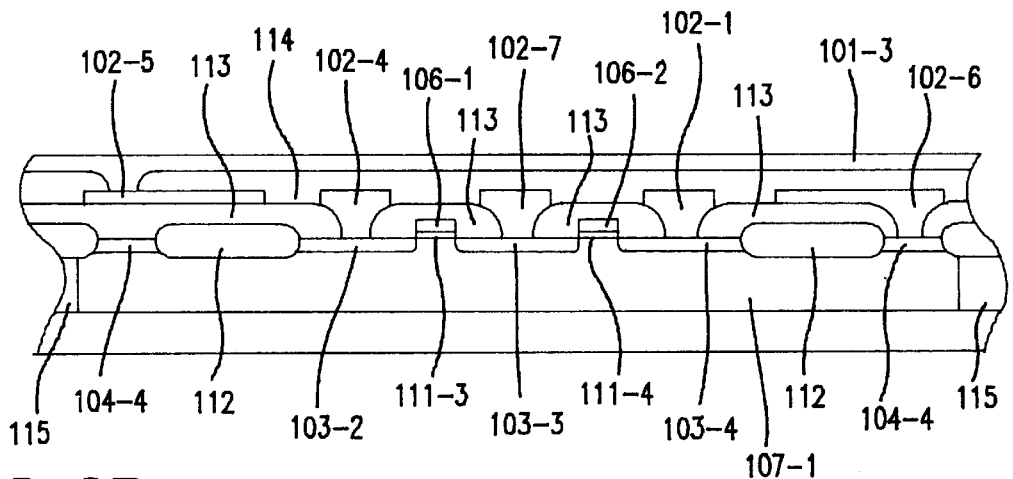
FIG. 3(b) is a section view taken along a line D–D' of the analog switch shown in FIG. 2.
Figure 2:
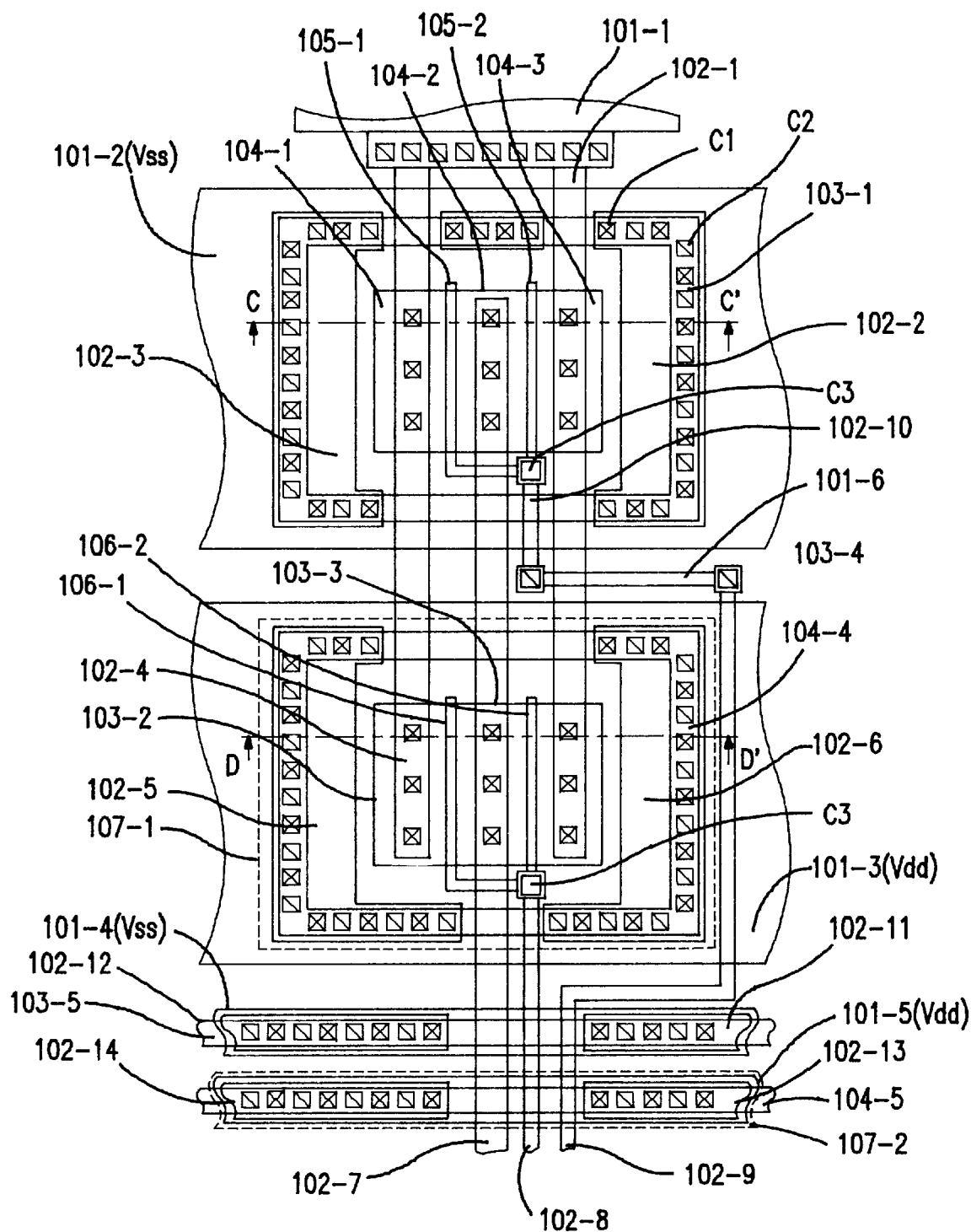
FIG. 2 is a view showing a layout example of an analog switch shown in FIG. 1.
Figure 4:
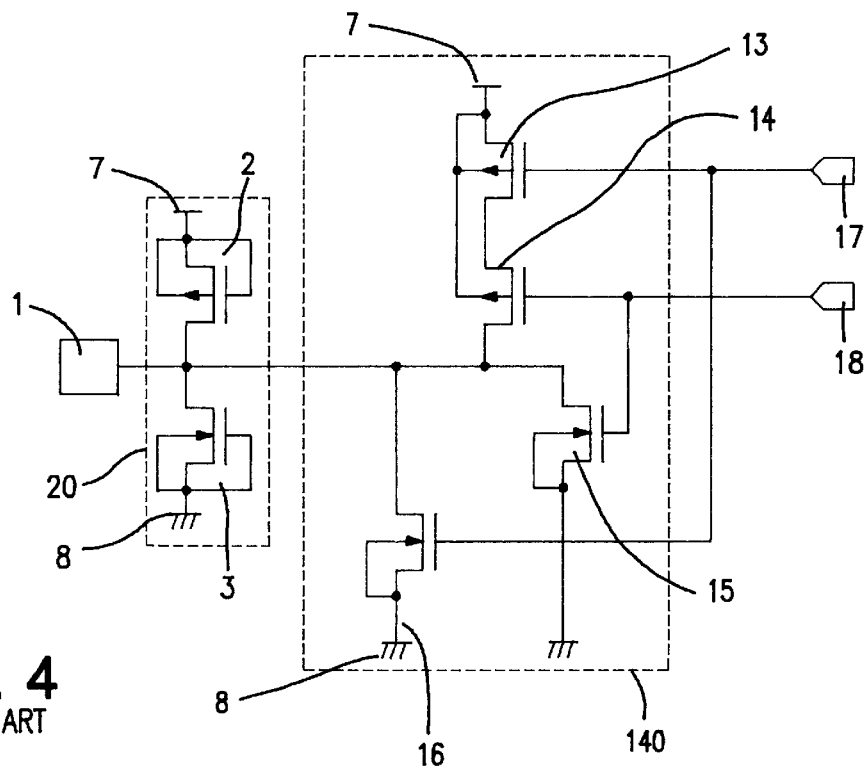
FIG. 4 is a circuit diagram showing another constitutional example of a conventional semiconductor device.
Figure 6:
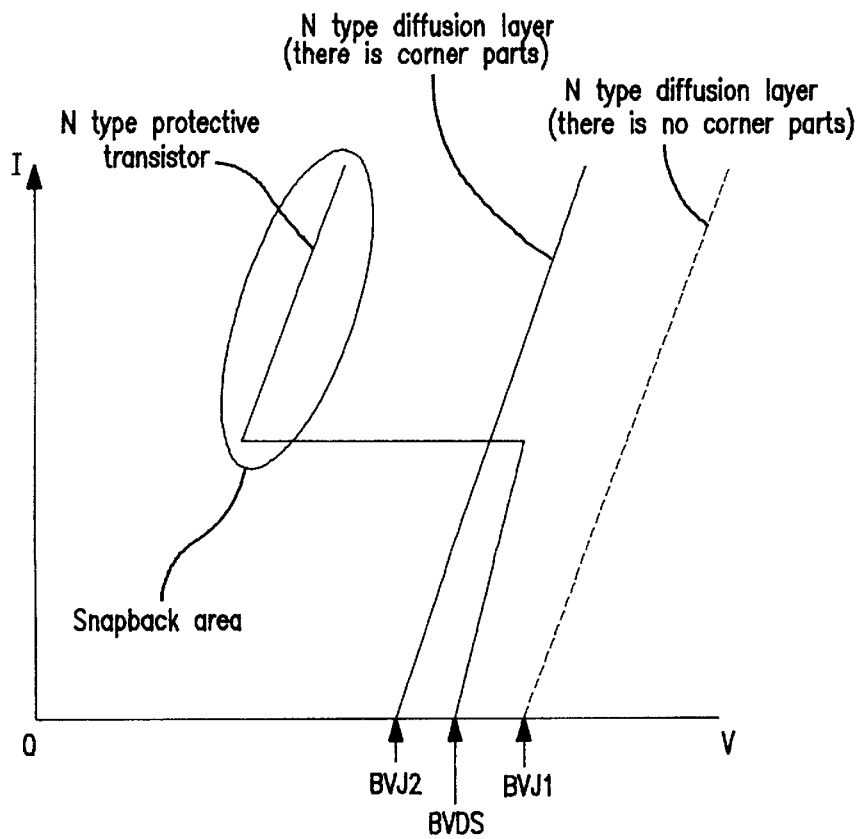
FIG. 6 is a view showing a breakdown voltage of the semiconductor device shown in FIG. 2.
Figure 5:
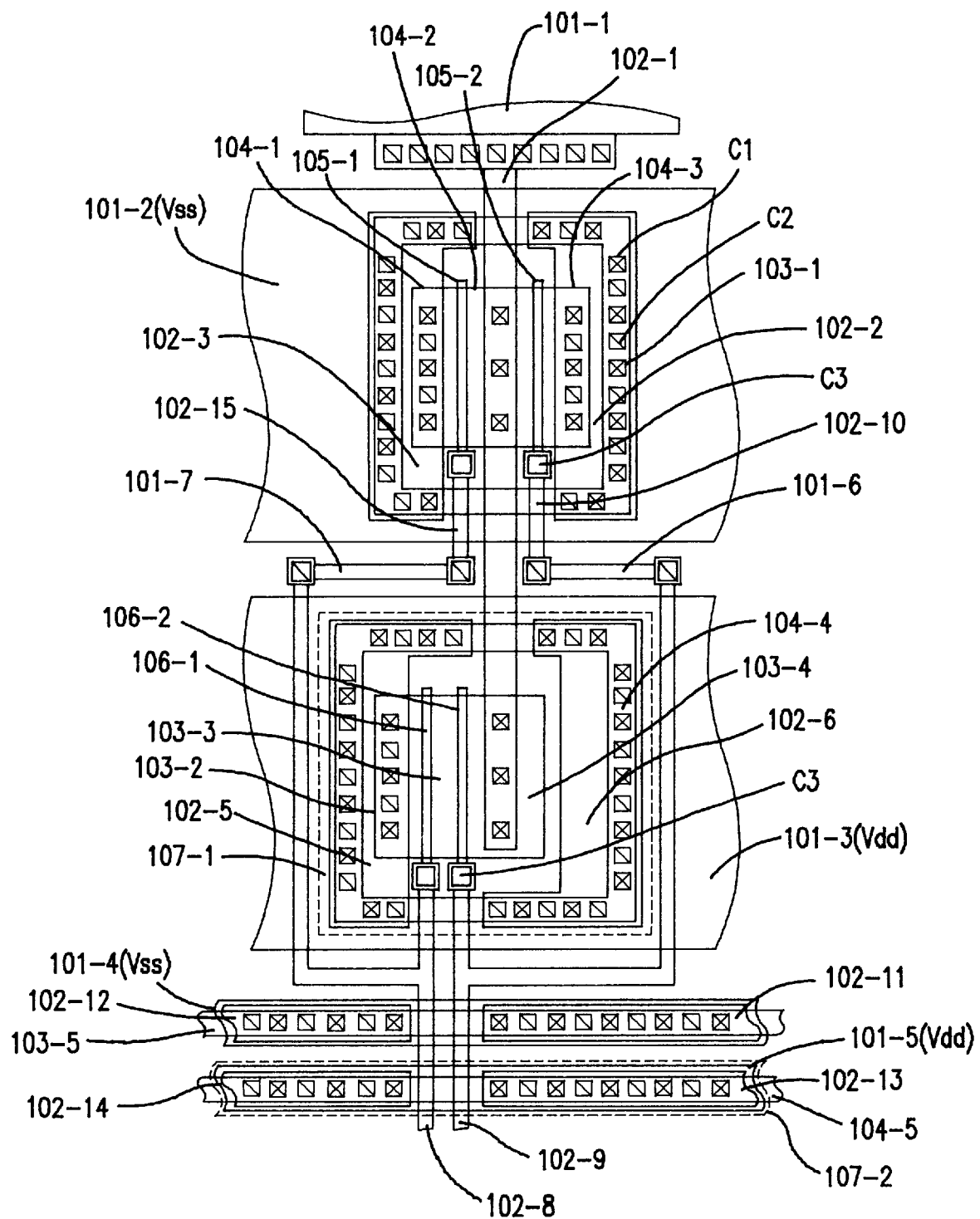
FIG. 5 is a view showing a layout example of an analog switch shown in FIG. 4.
Figure 7:
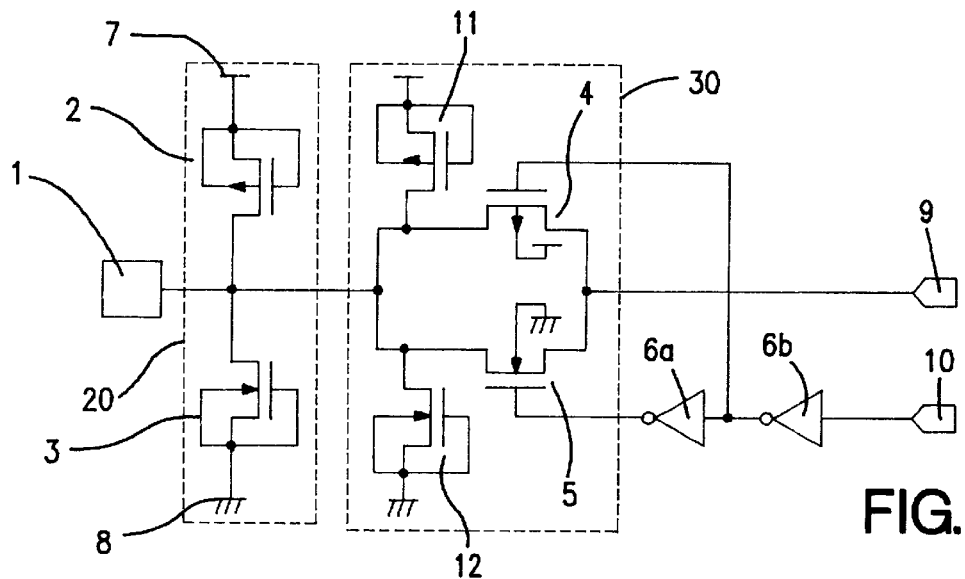
FIG. 7 is a circuit diagram showing a first embodiment of a semiconductor device of the present invention.

FIG. 7 is a circuit diagram showing the first embodiment of the semiconductor device of the present invention.

Referring to FIG. 7, in the first embodiment, the semiconductor device is composed of a bonding pad 1, which is for performing signal inputting and outputting, an analog switch 30, which is for transmitting analog signals between the bonding pad 1 and the other pads (not shown) or between the bonding pad 1 and an internal analog circuit (not shown), and a protective circuit 20, which is for protecting the analog switch 30. A signal input from an analog signal 9 is transmitted through the analog switch 30 and the protective circuit 20 to the bonding pad 1, a signal input from the bonding pad 1 is transmitted through the protective circuit 20 and the analog switch 30 to the analog signal 9, and so on. The analog switch 30 is provided with a P type transfer gate 4 as a P type MOS transistor and an N type transfer gate 5 as an N type MOS transistor, to whose gate terminals reverse phase control signals 10 are respectively input by inverters 6a and 6b, a P type dummy transistor 11 with its drain terminal connected to a P type diffusion layer in the external side of the P type transfer gate 4 and its gate and source terminals connected to a power supply potential, and an N type dummy transistor 12 with its drain terminal connected to an N type diffusion layer in the external side of the N type transfer gate 5 and its gate and source terminals connected to a ground potential. The protective circuit 20 is provided with a P type protective transistor 2 as a P type protective transistor with its source and gate terminals connected to a power supply potential 7 and its drain terminal connected to the bonding pad 1, and an N type protective transistor 3 as an N type protective transistor with its source and gate terminals connected to the ground potential and its drain terminal connected to the bonding pad 1.

Figure 8:
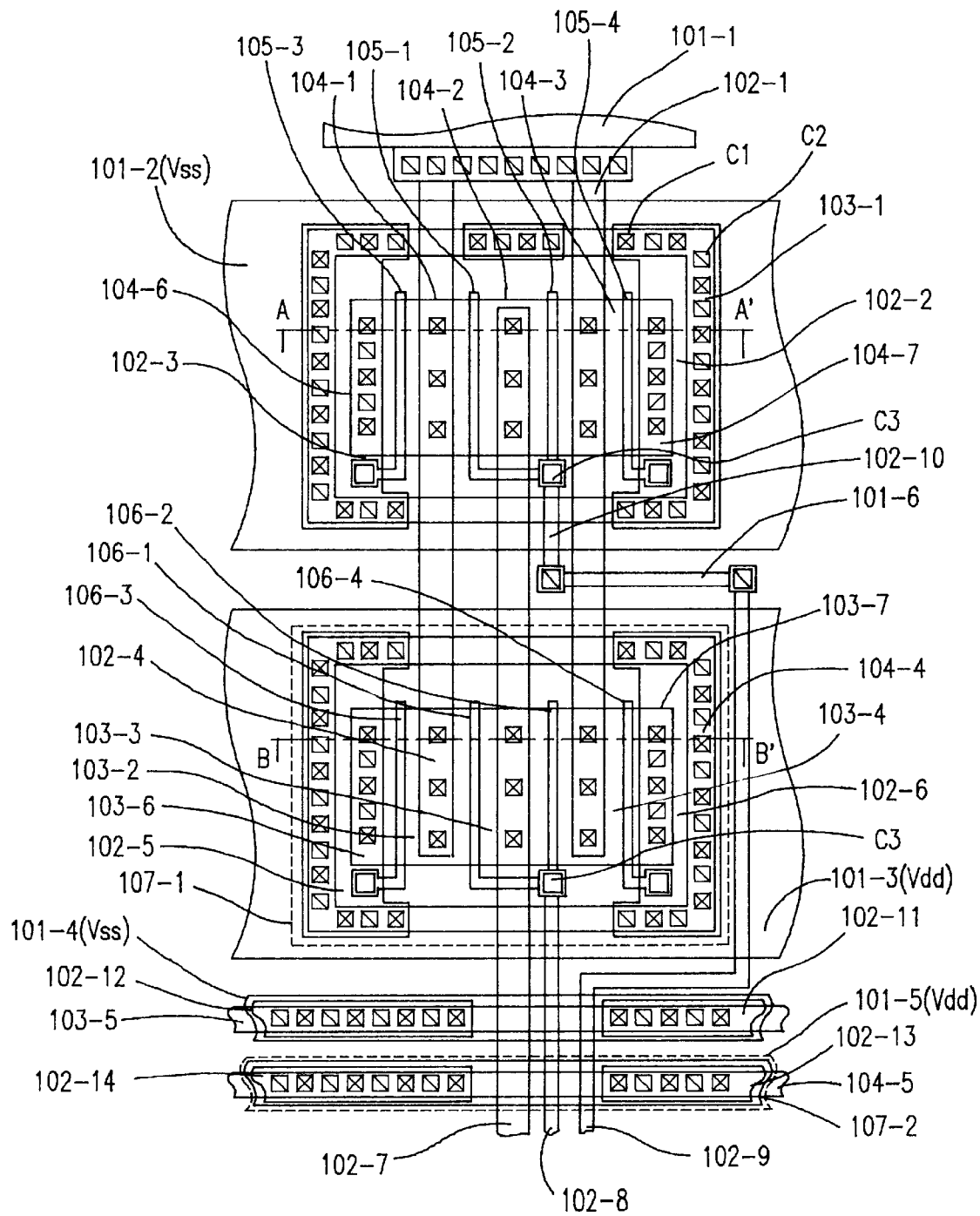
FIG. 8 is a view showing a layout example of an analog switch shown in FIG. 7.

FIG. 8 is a view showing a layout example of the analog switch 30 shown in FIG. 7.

Figure 9A:
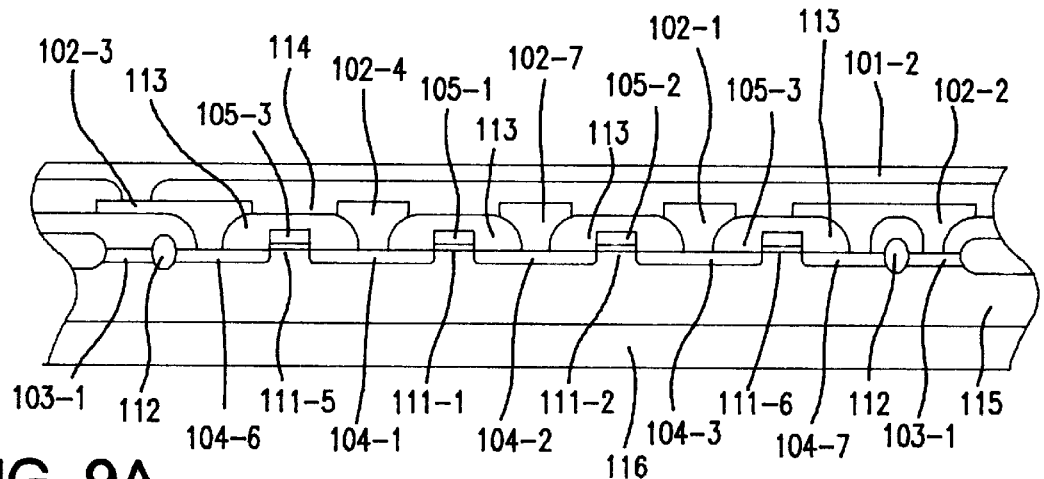
FIG. 9(a) is a section view taken along a line A–A' of the analog switch shown in FIG. 8.
Figure 9B:
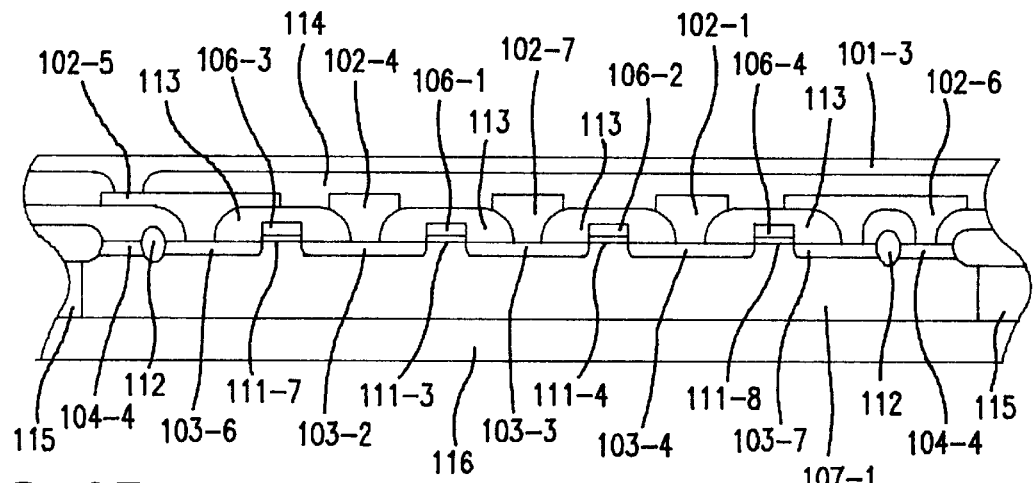
FIG. 9(b) is a section view taken along a line B–B' of the analog switch shown in FIG. 8.

FIG. 9(a) is a section view taken along the line A–A' of the analog switch 30 shown in FIG. 8, and FIG. 9(b) is a section view taken along the line B–B' of the analog switch 30 shown in FIG. 8.

Figure 10:
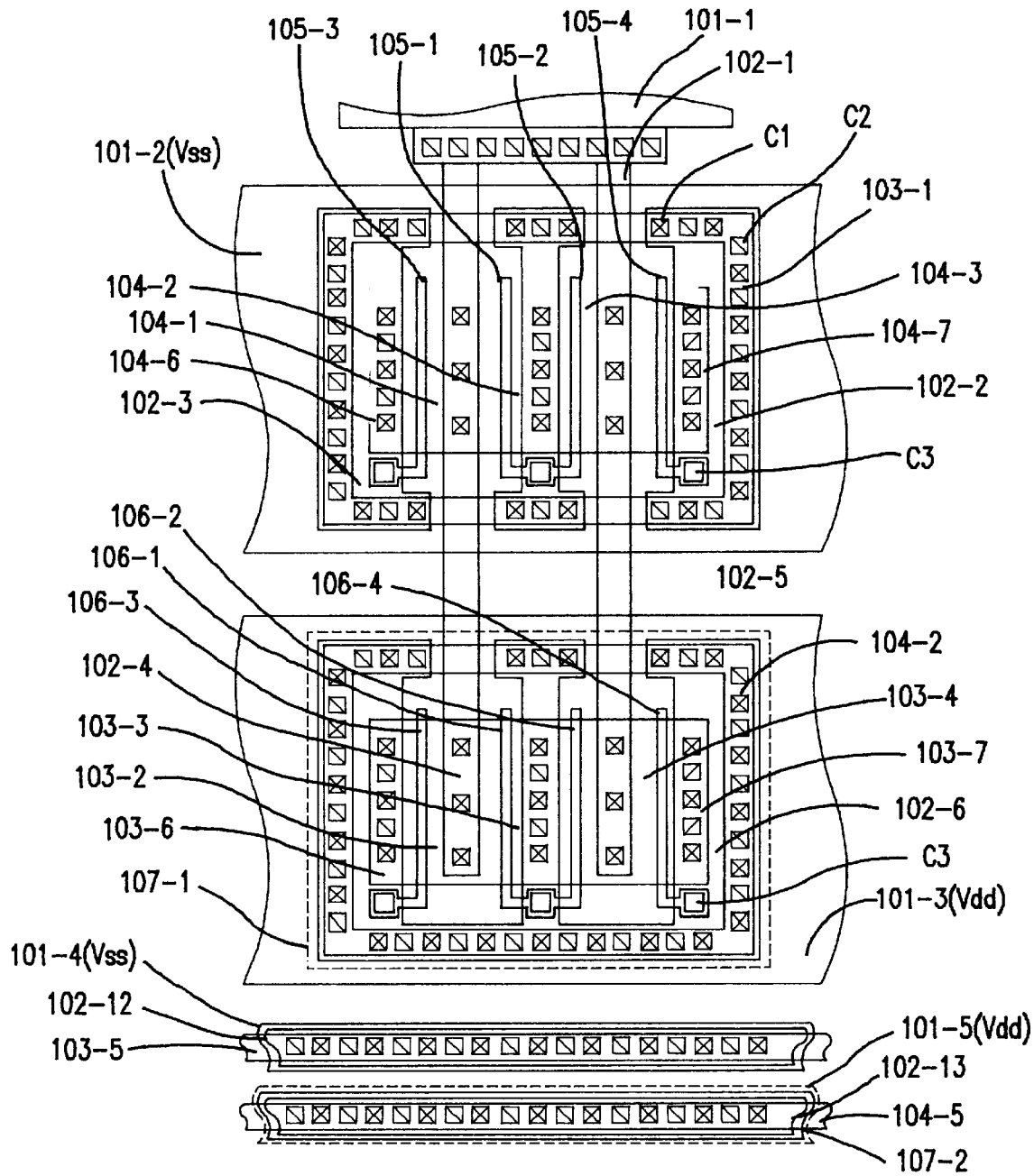
FIG. 10 is a view showing a layout example of a protective circuit shown in FIG. 7.

FIG. 10 is a view showing a layout example of the protective circuit 20 shown in FIG. 7.

Referring to FIG. 8, the bonding pad 1 is connected through a second layer metallic wiring 101-1 and first layer metallic wirings 102-1 and 102-4 to the N type diffusion layers 104-1 and 104-3 of the N type transfer gate 5 and the P type diffusion layers 103-2 and 103-4 of the P type transfer gate 4. In this manner, the bonding pad 1 and the analog switch 30 are connected to each other.

Herein, the N type diffusion layer 104-2 in the inner side of the N type transfer gate 5 and the P type diffusion layer 103-3 in the inner side of the P type transfer gate 4 are connected through a first layer metallic wiring 102-7 to an internal circuit.

For the N type diffusion layer 104-1 of the N type transfer gate 5, in a side opposite an N type diffusion layer 104-2, which is connected to the inside of the N type diffusion layer 104-1, there is laid out an N type dummy transistor, which shares the N type diffusion layer 104-1 as a drain and uses a gate electrode 105-3 and an N type diffusion layer 104-6 connected through a first layer metallic wiring 102-3 to a ground potential as a gate and a source respectively.

Similarly, for the N type diffusion layer 104-3 of the N type transfer gate 5, in a side opposite the N type diffusion layer 104-2, which is connected to the inside of the N type diffusion layer 104-3, there is laid out an N type dummy transistor, which shares the N type diffusion layer 104-3 as a drain and uses a gate electrode 105-4 and an N type diffusion layer 104-7 connected through a first layer metallic wiring 102-2 to the ground potential as a gate and a source respectively.

Herein, the N type diffusion layers 104-1 and 104-3 as the drains of the N type dummy transistors have the same structures as those of the N type diffusion layers 104-1 and 104-3 as the drains of the N type protective transistors shown in FIG. 10.

For the P type diffusion layer 103-2 of the P type transfer gate 4, in a side opposite a P type diffusion layer 103-3 connected to the inside of the P type diffusion layer 103-2, there is laid out a P type dummy transistor, which shares the P type diffusion layer 103-2 as a drain and uses a gate electrode 106-3 and a P type diffusion layer 103-6 connected through a first layer metallic wiring 102-5 to a power supply potential as a gate and source respectively.

Similarly, for the P type diffusion layer 103-4 of the P type transfer gate 4, in a side opposite the P type diffusion layer 103-3 connected to the inside of the P type diffusion layer 103-4, there is laid out a P type dummy transistor, which shares the P type diffusion layer 103-4 as a drain and uses a gate electrode 106-4 and a P type diffusion layer 103-7 connected through a first metallic wiring 102-6 to the power supply potential as a gate and a source respectively.

Herein, the P type diffusion layers 103-2 and 103-4 as the drains of the P type dummy transistors have the same structures as those of the P type diffusion layers 103-2 and 103-4 as the drains of the P type protective transistors shown in FIG. 10.

Furthermore, in order to prevent latching up, the N type transfer gate 5 is surrounded by a P type diffusion layer 103-1, which is connected to a ground potential (Vss) 8. Also, the P type transfer gate 4 is surrounded by an N type diffusion layer 104-4, which is connected to a power supply potential (Vdd) 7.

Figure 11:
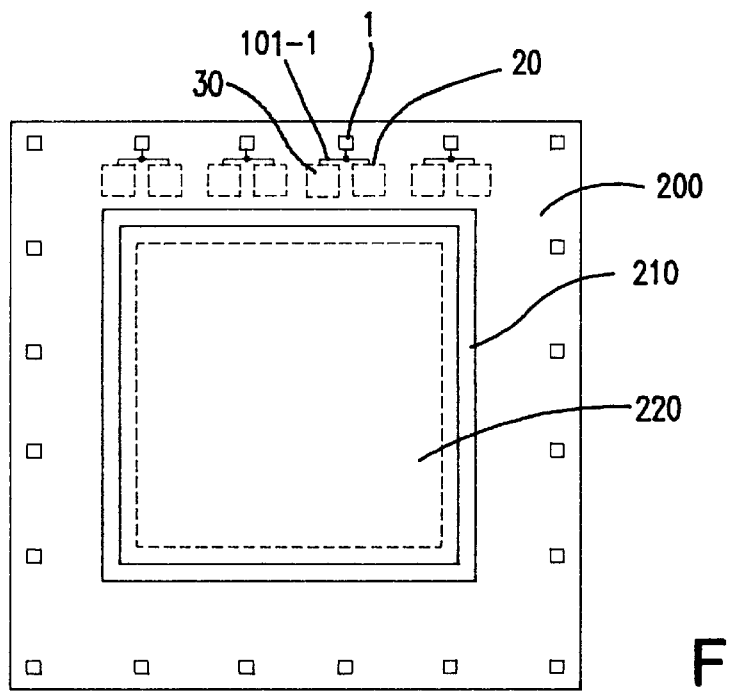
FIG. 11 is a view showing an arrangement of the analog switch shown in FIG. 7 in a chip.

FIG. 11 is a view showing the arrangement of the analog switch shown in FIG. 7 in a chip.

Referring to FIG. 11, the analog switch 30 is, as in the case of the protective circuit 20, arranged in a buffer region 200 divided from an internal region 220 by a guard ring 210.

The operation of the semiconductor device constructed in the foregoing manner when an excessive voltage is applied to the analog switch from the outside will be described below.

When a positive excessive voltage is applied to the ground, a breakdown occurs at the same voltage as the drain BVDS of the N type protective transistor 3 in the N type diffusion layers 104-1 and 104-3 connected to the outside of the N type transfer gate 5, because these have the same structures as the drain of the N type protective transistor 3, and in due time a snapback operation state is realized. After the snapback operation state has been realized, an excessive current is made to flow to the ground through the source of the N type dummy transistor 12 as in the case of the N type protective transistor 3.

When a negative excessive voltage is applied to a power source, a breakdown occurs at the same voltage as the drain BVDS of the P type protective transistor 2 in the P type diffusion layers 103-2 and 103-4 connected to the outside of the P type transfer gate 4, because these have the same structures as the drain of the P type protective transistor 2, and in due time a snapback operation state is realized. After the snapback operation state has been realized, an excessive current is made to flow to the power source through the source of the P type dummy transistor 11 as in the case of the P type protective transistor 2.

As described above, in the analog switch of the embodiment, different from the conventional analog switch, the diffusion layers are not destroyed by the concentration of current, and thus a high protective capability against excessive voltage from the outside is provided.

In addition, the P type and N type dummy transistors 11 and 12 function, when an excessive voltage is applied from the outside, so as to turn away the excessive voltage to the power source and the ground as in the case of the P type and N type protective transistors 2 and 3.

As a result, even when the channel widths of the P type and N type protective transistors 2 and 3 are reduced more than in the conventional case, an ESD capability the same as or higher than the conventional example can be obtained. Moreover, when the channel widths of the P type and N type dummy transistors 11 and 12 are large, even without providing the P type and N type protective transistors 2 and 3, a sufficient ESD capability can be obtained.

(Second Embodiment)

Figure 12:
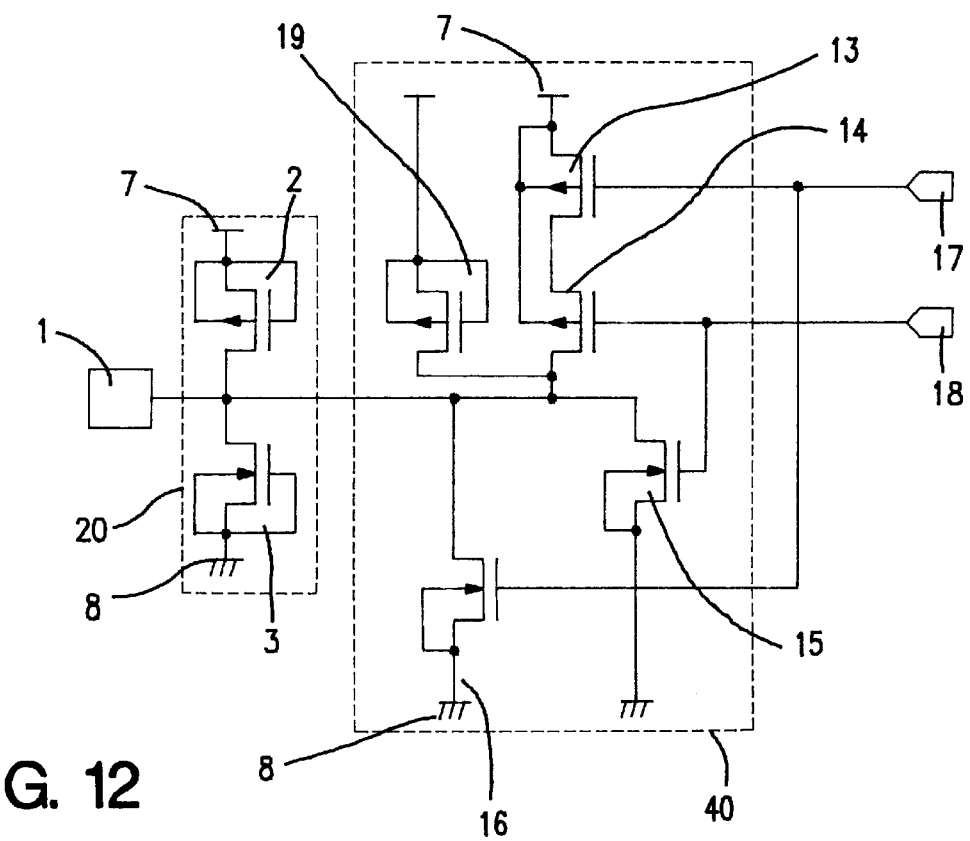
FIG. 12 is a circuit diagram showing a second embodiment of a semiconductor device of the present invention.

FIG. 12 is a circuit diagram showing a second embodiment of a semiconductor device of the present invention.

Referring to FIG. 12, the semiconductor device is composed of a NOR type output circuit 40 and a protective circuit 20, which is for protecting the NOR type output circuit 40. A signal input from a data signal 18 is transmitted through the NOR type output circuit 40 and the protective circuit 20 to the bonding pad 1, a signal input from the bonding pad 1 is transmitted through the protective circuit 20 and the NOR type output circuit 40 to the data signal 18, and so on. The NOR type output circuit 40 is provided with P type and N type transistors 13 and 16, which are connected to a control signal 17, P type and N type transistors 14 and 15, which are connected to the data signal 18, and a P type dummy transistor 19 with its gate and source terminals connected to a power supply potential 7 and its drain terminal connected to the protective circuit 20. The protective circuit 20 is provided with a P type protective transistor 2 with its source and gate terminals connected to the power supply potential 7 and its drain terminal connected to the bonding pad 1, and an N type protective transistor 3 with its source and gate terminals connected to a ground potential and its drain terminal connected to the bonding pad 1.

Figure 13:
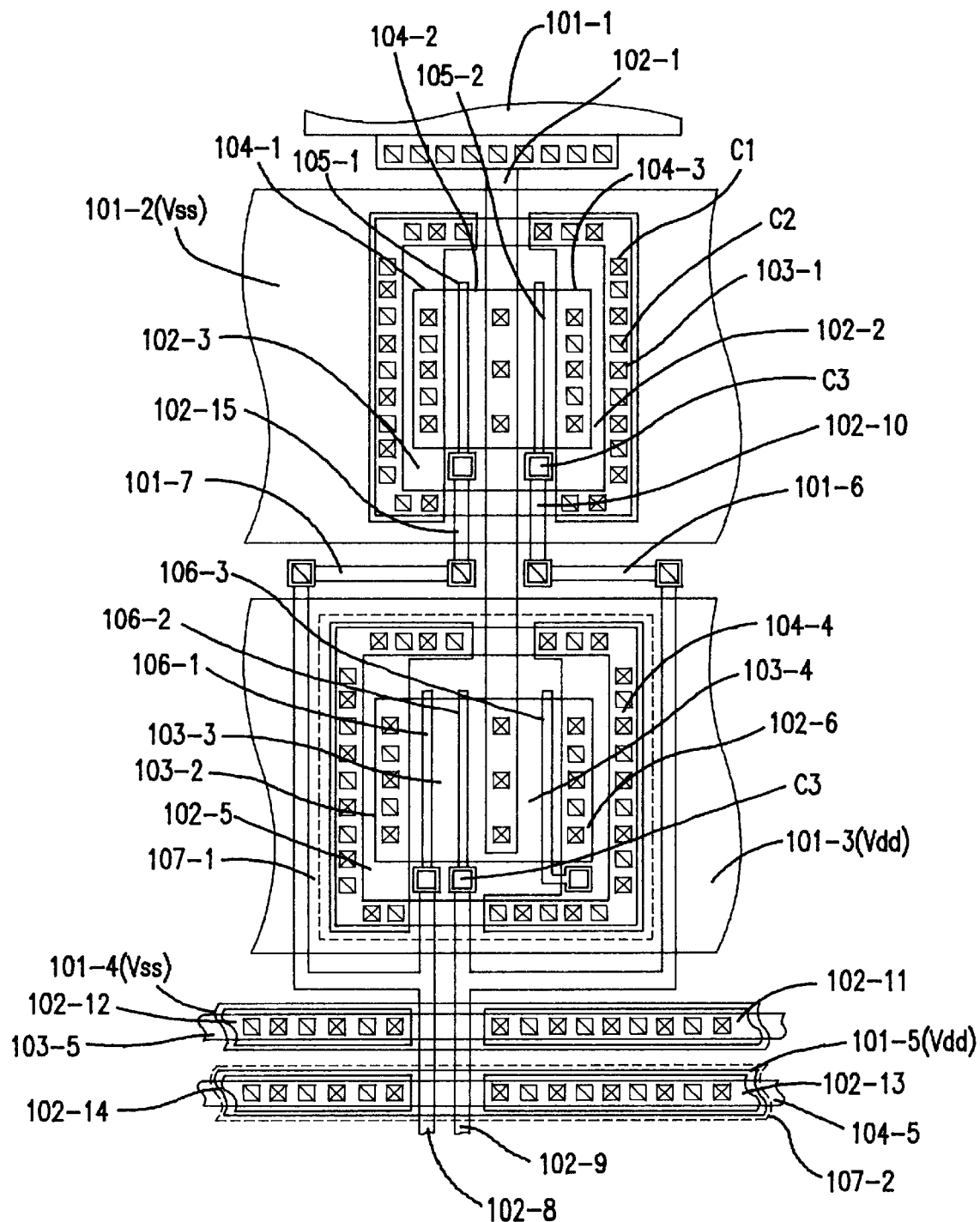
FIG. 13 is a view showing a layout example of a NOR type output circuit shown in FIG. 12.

FIG. 13 is a view showing a layout example of the NOR type output circuit 40 shown in FIG. 12.

Referring to FIG. 13, in the side of a P type diffusion layer 103-4 in the drain part of a vertically placed P type transistor, there is laid out a P type dummy transistor 19, which shares the P type diffusion layer 103-4 as a drain.

Therefore, as in the case of the first embodiment, an excessive voltage from the outside is made to flow through the P type dummy transistor 19 to a power source and an ESD protective capability can be increased without breaking down the P type transistor.

By referring to FIGS. 12 and 13, explanation was made of the NOR type output circuit, which was is formed by connecting the two P type transistors 13 and 14 to each other in series between the power supply potential and the pad. However, the present invention is not limited to the NOR type output circuit. The same effect can be obtained by a circuit which has two or more P type transistors connected in series between the power supply potential and the pad, or a circuit which has two or more N type transistors connected in series between the pad and the ground potential, for instance a NAND type output circuit with two N type transistors connected in series between the pad and the ground potential. This is possible by providing, in the case of the circuit having two or more serially connected P type transistors, a P type dummy transistor between the power supply potential and the pad, and in the case of the circuit having two or more serially connected N type transistors, an N type dummy transistor between the pad and the ground potential.

As apparent from the foregoing, according to the present invention, since in a spot, in which the diffusion layer ends divided by the gate of the MOS transistor are connected to the pad, there is provided a dummy transistor with the diffusion layer used as a drain and with its gate and source connected to the ground potential or the power supply potential, if an excessive voltage of static electricity or the like, is applied through the pad to the semiconductor device, an excessive current is made to flow to the power source or the ground by the dummy transistor, and thereby the occurrence of a breakdown at a voltage lower than the breakdown voltage of the protective transistor can be prevented. As a result, it is possible to prevent the breakdown of the MOS transistor.

Although the preferred embodiment of the present invention has been described in detail, it should be understood that various changes, substitutions and alternations can be made therein without departing from spirit and scope of the inventions as defined by the appended claims.

What is claimed is:

1. A semiconductor device comprising:
   a plurality of pads for performing signal inputting and outputting, said pads comprising an input pad and an output pad;
   an analog switch, which is provided with P type and N type MOS transistors for transmitting signals among said pads, said N type MOS transistor comprising first and second N type diffusion layers separated by a gate of said N type MOS transistor, said first N type diffusion layer connected to said input pad and said second N type diffusion layer connected to said output pad; and
   a protective circuit, which is provided with P type and N type protective MOS transistors for protecting said analog switch,
   wherein said analog switch is further provided with an N type dummy transistor, said N type dummy transistor being formed by using said first N type diffusion layer as a drain and connecting a gate and a source to a ground potential.

2. The semiconductor device according to claim 1, wherein said P type MOS transistor comprises first and second P type diffusion layers separated by a gate of said P type MOS transistor, said first P type diffusion layer connected to said input said and said second P type diffusion layer connected to said output pad, and wherein said analog switch is further provided with a P type dummy transistor, said P type dummy transistor being formed by using said first P type diffusion layer as a drain and connecting a gate and a source to a power supply potential.

3. The semiconductor device according to claim 1, wherein said N type protective MOS transistor is formed using said first N type diffusion layer as a drain.

4. A semiconductor device comprising:
   a plurality of pads for performing signal inputting and outputting, said pads comprising an input pad and an output pad;
   an analog switch, which is provided with P type and N type MOS transistors for transmitting signals among said pads, said P type MOS transistor comprising first and second P type diffusion layers separated by a gate of said P type MOS transistor, said first P type diffusion layer connected to said input pad and said second P type diffusion layer connected to said output pad; and
   a protective circuit, which is provided with P type and N type protective MOS transistors for protecting said analog switch,
   wherein said analog switch is further provided with a P type dummy transistor, said P type dummy transistor being formed by using said first P type diffusion layer as a drain and connecting a gate and a source to a power supply potential.

5. The semiconductor device according to claim 2, wherein said P type protective MOS transistor is formed using said first P type diffusion layer as a drain.

6. A semiconductor device comprising:
   a plurality of pads for performing signal inputting and outputting, said pads comprising input pad and an output pad;
   an output circuit, which is provided with first and second P type MOS transistors connected to each other in series between a power supply potential and said output pad, said first P type MOS transistor comprising first and second P type diffusion layers separated by a gate of said first P type MOS transistor, said first P type diffusion layer connected to said output sad; and
   a protective circuit, which is provided with P type and N type protective MOS transistors for protecting said output circuit,
   wherein said output circuit is further provided with a P type dummy transistor, said P type dummy transistor being formed by using said first P type diffusion layer as a drain and connecting a gate and a source to said power supply potential.

7. The semiconductor device according to claim 6, wherein said output circuit is a NOR type output circuit.

8. The semiconductor device according to claim 6, wherein said P type protective MOS transistor is formed using said first P type diffusion layer as a drain.

9. A semiconductor device comprising:
   a plurality of pads for performing signal inputting and outputting, said pads comprising an input pad and an output pad;
   an output circuit, which is provided with first and second N type MOS transistors connected to each other in series between a ground potential and said output pad, said first N type MOS transistor comprising first and second N type diffusion layers separated by a gate of said first N type MOS transistor, said first N type diffusion layer being connected to said output pad; and
   a protective circuit, which is provided with P type and N type protective MOS transistors for protecting said output circuit,
   wherein said output circuit is further provided with an N type dummy transistor, said N type dummy transistor being formed by using said first N type diffusion layer as a drain and connecting a gate and a source to said ground potential.

10. The semiconductor device according to claim 9, wherein said output circuit is a NAND type output circuit.

11. The semiconductor device according to claim 9, wherein said N type protective MOS transistor is formed using said first N type diffusion layer as a drain.

* * * * *